United States Patent
Mizuno et al.

(10) Patent No.: US 9,770,850 B2
(45) Date of Patent: Sep. 26, 2017

(54) IMPRINT APPARATUS AND ARTICLE MANUFACTURING METHOD

(71) Applicants: CANON KABUSHIKI KAISHA, Tokyo (JP); CANON NANOTECHNOLOGIES, INC., Austin, TX (US); MOLECULAR IMPRINTS, INC., Austin, TX (US)

(72) Inventors: Makoto Mizuno, Utsunomiya (JP); Tsuyoshi Arai, Utsunomiya (JP); Yukio Takabayashi, Saitama (JP); Steven C. Shackleton, Austin, TX (US); Byung-Jin Choi, Austin, TX (US)

(73) Assignees: CANON KABUSHIKI KAISHA, Tokyo (JP); CANON NANOTECHNOLOGIES, INC., Austin, TX (US); MOLECULAR IMPRINTS, INC., Austin, TX (US)

( * ) Notice: Subject to any disclaimer, the term of this patent is extended or adjusted under 35 U.S.C. 154(b) by 507 days.

(21) Appl. No.: 14/254,364

(22) Filed: Apr. 16, 2014

(65) Prior Publication Data
US 2014/0312532 A1 Oct. 23, 2014

(30) Foreign Application Priority Data
Apr. 18, 2013 (JP) ................................ 2013-087691

(51) Int. Cl.
*B29C 43/20* (2006.01)
*B29C 43/02* (2006.01)
(Continued)

(52) U.S. Cl.
CPC .......... *B29C 43/203* (2013.01); *B29C 43/021* (2013.01); *G03F 7/0002* (2013.01);
(Continued)

(58) Field of Classification Search
None
See application file for complete search history.

(56) References Cited

U.S. PATENT DOCUMENTS

| 7,090,716 B2 | 8/2006 | McMackin et al. |
| 2004/0131718 A1* | 7/2004 | Chou ............... G03F 7/0002 425/385 |

(Continued)

FOREIGN PATENT DOCUMENTS

| JP | 2005136263 A | 5/2005 |
| JP | 2007509769 A | 4/2007 |
| WO | 2011100050 A2 | 8/2011 |

OTHER PUBLICATIONS

Office Action issued in Japanese Appln. No. 2013-087691 mailed Feb. 7, 2017. English translation provided.

*Primary Examiner* — Christopher Schatz
(74) *Attorney, Agent, or Firm* — Rossi, Kimms & McDowell LLP

(57) ABSTRACT

Provided is an imprint apparatus that imprints a pattern formed on a mold onto a substrate. The imprint apparatus includes a substrate holder that holds the substrate and can move in a direction along the surface of the substrate; a gas supply unit for supplying a gas into a space between a pattern part of the mold and the substrate; and a wall part that is disposed so as to enclose the space that is supplied with gas, wherein at a position opposed to the substrate and the mold, the wall part faces the substrate holder or the substrate with a gap therebetween.

14 Claims, 3 Drawing Sheets

(51) Int. Cl.
*G03F 7/00* (2006.01)
*B29K 101/00* (2006.01)
*B29L 31/34* (2006.01)
*B29L 11/00* (2006.01)

(52) U.S. Cl.
CPC .... *B29C 2043/025* (2013.01); *B29K 2101/00* (2013.01); *B29L 2011/00* (2013.01); *B29L 2031/34* (2013.01)

(56) References Cited

U.S. PATENT DOCUMENTS

2005/0072755 A1* 4/2005 McMackin ............ B82Y 10/00
                                                                    216/44
2007/0063384 A1   3/2007 Choi et al.

* cited by examiner

IMPRINT APPARATUS AND ARTICLE MANUFACTURING METHOD

BACKGROUND OF THE INVENTION

Field of the Invention

The present invention relates to an imprint apparatus and an article manufacturing method.

Description of the Related Art

The demand for micronization of semiconductor devices and MEMS and the like is increasing, and in addition to conventional photolithography technologies, a microfabrication technology in which an uncured resin on a substrate is molded by using a mold and a resin pattern is formed on a substrate is gaining attention. This technology is referred to as "imprint technology", and it can form a fine structure on the order of several nanometers on a substrate. One example of an imprint technology is a photo-curing method. In an imprint apparatus that uses this photo-curing method, first an ultraviolet light-cured resin (imprint material, photo-cured resin) is applied to a shot, which is an imprint area on a substrate (wafer). Next, this resin (photo-cured resin) is molded by using a mold. In addition, a pattern of the resin is formed on the substrate by separating the cured resin after the resin has been cured by irradiating an ultraviolet light.

In this type of imprint apparatus, when a resin is filled into a fine contoured portion formed in a mold during the pressing of the mold and the resin on the substrate, there are cases in which a resin pattern does not form correctly because of unfilled portions occurring due to bubbles remaining in the resin. Thus, conventionally, an imprint apparatus has been proposed that suppresses the retention of bubbles by filling a gap space sandwiched between the mold and the substrate (resin) during pressing with a special gas. Japanese Translation of PCT International Application Publication No. JP-T-2007-509769 discloses an imprint lithography method that includes a step in which a gas having a high solubility or high diffusibility is fed at a position in close proximity to the viscous liquid resin on the substrate.

However, as disclosed in Japanese Translation of PCT International Application Publication No. JP-T-2007-509769, in a state in which only the gap space between a mold and a substrate is locally filled with a special gas, ambient air will flow from outside the gap space into the gap space when the substrate is moved (scanned) in a direction parallel to the mold. In this situation, because the effect is obtained in which the retention of bubbles is restrained by supplying a gas into the gap space, the gas concentration inside the gap space must, to a certain extent, be maintained at a high value. However, in this case, raising the gas concentration up to a high value is difficult due to the inflow of air. Therefore, in a conventional imprint apparatus, for example, the supplied amount of gas is large, and not just the inside of the gap space, but a wide area in the vicinity of the mold must be filled in advance.

SUMMARY OF THE INVENTION

The present invention provides an imprint apparatus that is advantageous for, for example, efficiently suppressing the occurrence of unfilled portions in a resin pattern.

According to an aspect of the present invention, an imprint apparatus that imprints a pattern formed in a mold onto a substrate is provided that includes a substrate holder that holds the substrate and can move in a direction along the surface of the substrate; a gas supply unit for supplying a gas into a space between a pattern part of the mold and the substrate; and a wall part that is disposed so as to enclose the space that is supplied with gas, wherein at a position opposed to the substrate and the mold, the wall part faces the substrate holder or the substrate with a gap therebetween.

Further features of the present invention will become apparent from the following description of exemplary embodiments with reference to the attached drawings.

DESCRIPTION OF THE EMBODIMENTS

Hereinafter, preferred embodiments of the present invention will be described with reference to the drawings.

Figure 1:
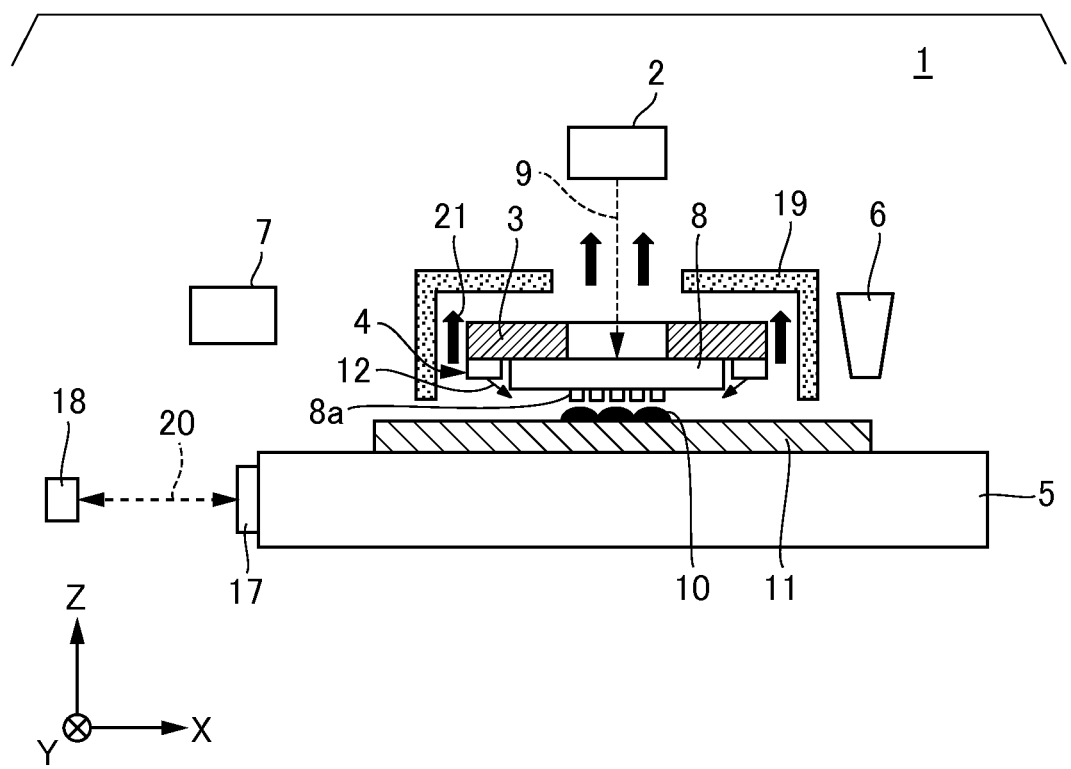
FIG. 1 is a drawing that shows a configuration of an imprint apparatus according to an embodiment of the present invention.

First, an imprint apparatus according to an embodiment of the present invention will be explained. FIG. 1 is a schematic drawing that shows a configuration of an imprint apparatus 1 according to the present embodiment. The imprint apparatus 1 is an apparatus that is used in the manufacture of devices such as semiconductor devices as an article. The imprint apparatus 1 molds an uncured resin on a wafer (on a substrate), which is the treated substrate, by using a mold (original), and forms a pattern in the resin on the wafer. Note that in this context, an imprint apparatus that uses a photo-curing method is exemplified. In addition, in the figures below, the Z axis is aligned parallel to the optical axis of the irradiation system that irradiates ultraviolet light onto the resin on a wafer, and the X axis and the Y axis are aligned so as to be mutually perpendicular within a plane that is perpendicular to the Z axis. The imprint apparatus 1 is first provided with a light irradiation unit 2, a mold holding mechanism 3, a gas supply mechanism 4, a wafer stage 5, a dispenser 6, and a controller 7.

The light irradiation unit 2 irradiates the mold 8 with ultraviolet light 9 during the imprint process. Although not illustrated, this light irradiation unit 2 includes a light source and an irradiation optical system that adjusts the ultraviolet light 9 that has been emitted from this light source to a light suitable for imprinting, and then irradiates the mold 8. Lamps such as a mercury lamp can be used as a light source, and the light source is not particularly limited provided that the light source emits light that passes through to the mold 8 and has a wavelength by which the resin described below (ultraviolet light-cured resin) 10 is cured. The irradiation light system can include lenses, mirrors, an aperture, or a shutter for switching between irradiation and light shielding. Note that in the present embodiment, a light irradiation unit 2 is installed in order to use a photo-curing method, but when using, for example, a heat-curing method, a heat source unit for curing a heat-cured resin may be installed instead of the light irradiation unit 2.

The outer peripheral profile of the mold 8 is polygonal (advantageously, a rectangular profile or a square profile), and includes a pattern part 8a by which, for example, a contoured pattern 3 for a circuit pattern and the like to be transferred is formed three-dimensionally on the surface opposed to the wafer 11. Note that although various pattern sizes differ depending on the article that is the object of manufacture, a pattern of tens of nanometers in a fine article is also included. In addition, the material of the mold 8 preferably allows passage of ultraviolet light 9 and has a low thermal expansion rate. Thus, for example, silicon can be used. Furthermore, at the surface on which ultraviolet light 9 is irradiated, the mold 8 may also include a cavity (recessed portion) that has a flat surface profile that is circular, and that has a certain depth.

Although not illustrated, a mold holding mechanism (mold holding unit) 3 includes a mold chuck that holds the mold 8 and a mold drive mechanism that holds this mold chuck and moves the mold 8. The mold chuck can hold the mold 8 by pulling the outer peripheral area of the surface of the mold 8, which is irradiated by the ultraviolet light 9, by using a vacuum suction force or static electrical force. For example, in the case in which the mold chuck holds the mold 8 by a vacuum suction force, the mold chuck is connected to a vacuum pump that is installed externally, and the mold chuck switches between attaching and detaching the mold 8 by turning this vacuum pump ON or OFF. In addition, the mold chuck and the mold drive mechanism include an open area in the center portion (inside) such that the ultraviolet light 9 that is irradiated from the light irradiation unit 2 pass through the mold 8 toward the wafer 11. The mold drive mechanism moves the mold 8 in each axial direction such that the pressing and separating between the mold 8 and the resin 10 on the wafer 11 is selectively carried out. For example, a linear motor or an air cylinder can be used to provide a drive force in this mold drive mechanism. In addition, in order to accommodate the high precision positioning of the mold 8, the mold drive mechanism may be structured by a plurality of drive systems, such as a coarse movement drive system and a fine movement drive system. Furthermore, a structure is also possible that includes, for example, a position adjustment function not only for the Z axis direction, but also for the X axis direction and the Y axis direction or a θ (rotation around the Z axis) direction, and a tilt function for correcting the tilt of the mold 8. Note that although the pressing and separating operations in the imprint apparatus 1 may also be realized by moving the mold 8 in the Z axis direction, this may be realized by moving the wafer stage 5 in the Z axis direction or moving both relative to each other.

Figure 2:
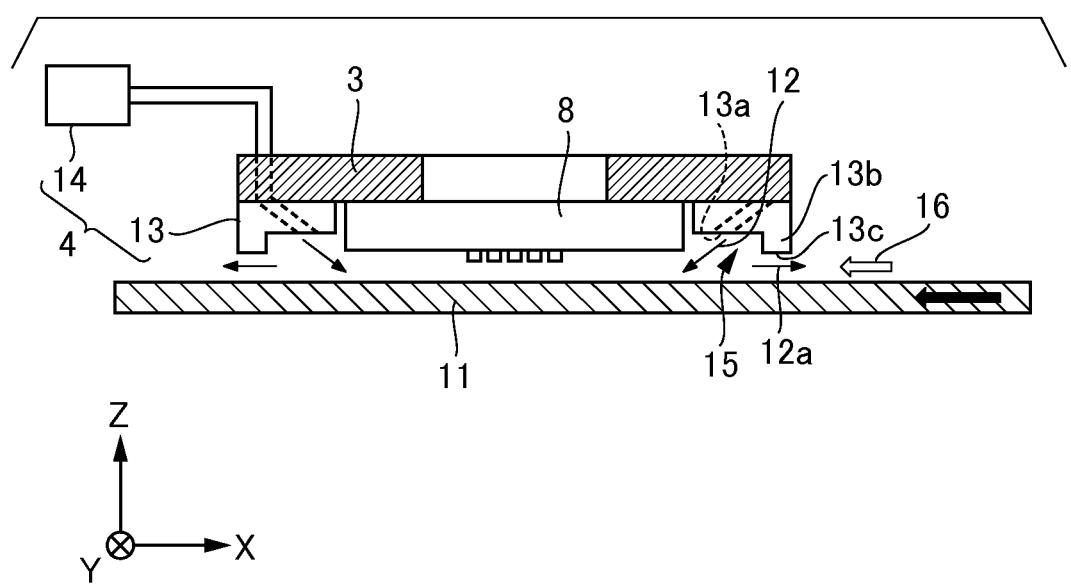
FIG. 2 is a drawing that shows the configuration of the vicinity of the mold.

The gas supply mechanism (gas supply unit) 4 supplies a gas to the space (below, referred to as the "gap space") between the mold 8 and the wafer 11 during the pressing operation. This is in order to improve the filling characteristics by reducing the time during which the resin 10 is filled into the contoured pattern of the pattern part 8a and by suppressing bubbles from being retained in the filled resin 10. In addition, in order to improve the mold separation characteristics in which the separation force is reduced as much as possible, the gas supply mechanism can supply a gas in the same manner during the separation operation. FIG. 2 is a schematic cross-sectional view that shows the configuration at the periphery of the mold 8, which opposes the surface of the wafer 11. The gas supply mechanism 4 includes a plurality of blowing units 13 that emit a gas 12 toward the side of the wafer 11 that is mounted on the wafer stage 5 and a supply unit 14 that is connected to this blowing unit 13 and controls the supply of the gas 12 while suitably adjusting the supplied amount of gas 12. Note that from the viewpoint of filling characteristics and the mold separation characteristics described above, a gas having superior solubility and diffusibility in the resin 10, such as helium, carbon dioxide, nitrogen, hydrogen, xenon, or a compressible gas, are preferable for a gas 12 that can be used.

The blowing unit 13 is arranged over the entire periphery of the outer peripheral area of the mold 8, which is being held, at a surface facing the wafer stage 5 side of the mold holding mechanism 3 (mold chuck). Note that in this manner, the blowing unit 13 may be arranged such that a gas 12 is ejected only from the one side of the periphery of the mold 8 instead of a structure that ejects gas 12 from the entire peripheral side of the mold 8. In addition, preferably an blowing port (supply port) 13a for the gas 12 that is formed in the blowing unit 13 has a fixed angle, as shown in FIG. 2, in order to supply gas 12 into the gap space with a high efficiency during the pressing operation. Furthermore, the surface of the blowing unit 13 that is opposed to the wafer stage 5 is not a flat surface having a uniform height, but includes a projecting portion (wall part) 13b that forms a buffer space 15 at a position opposed to the mold 8 and the wafer 11 and at the side surface of the mold 8 in a direction parallel to the surface of the wafer 11. The buffer space 15 is a space, which is opposed to the blowing ports 13a, by which a gas 12 is supplied, and is a space that maintains a gas concentration at a high value by retaining the gas 12 a fixed time. In addition, in order to maintain the gas concentration with a high efficiency, at part of the projection portion 13b, the position (height) of the opposed surface 13c of the end portion that opposes the wafer stage 5 is set such that the gap with the surface of the wafer 11 on the wafer stage 5 becomes narrow during pressing. Below, the gap amount (tolerance) between the opposed surface 13c and the surface of the wafer 11 that is mounted on the wafer stage 5 will be explained.

Normally, a plurality of shots is present on a wafer 11, and the wafer stage 5 repeatedly moves in order to move the shot that is the treatment object to the pressing position. At this time, the air that is present at the outside of the blowing unit 13 flows toward the inside at which the mold 8 is present due to the gas flow that accompanies the movement of the surface of a wafer 11. For example, as shown in FIG. 2, it is assumed that the wafer stage 5 moves from the right side to the left side on the page in the X axis direction. In this case, if no special precautions are taken, the air that is present at the outside of the blowing unit 13 is carried along with the gas flow 16, and flows from the gap between the opposed surface 13c and the surface of the wafer 11 into a buffer space 15 on the inside of the blowing unit 13. Thus, in the present embodiment, the gap amount between the opposed surface 13c and the surface of the wafer 11 is set in conformity with the supplied amount of the gas 12 that is set for the supply unit 14 so that the concentration of the gas 12 inside the buffer space 15 does not decrease due to the air that flows in from the outside, and the concentration is thereby maintained at a high value. For example, first, preferably the end portion of the projecting portion 13b is disposed in a direction perpendicular to the surface of the wafer 11, that is, in a direction opposed to the opposing surface 13c and the wafer 11, so as to be positioned more toward the wafer stage 5 side than the blowing ports 13a. In addition, preferably the end portion of the projecting portion 13b is similarly disposed in a direction perpendicular to the surface of the wafer 11 at a position more separated from the wafer stage 5 than the pattern part 8a. Additionally, the gap amount is set such that the flow rate of the gas 12a that passes under the opposing surface 13c and flows out to the outside increases more than the flow rate of the gas 12 that flows out from the blowing ports 13a. For example, the flow rate of the gas 12a at this time may be adjusted so as to become equal to or greater than the speed at which the wafer 11 moves (equal to or greater than the movement speed of the wafer stage 5). That is, the inflow of external air into the buffer space 15 can be prevented even if the wafer 11 is moving by directing the gas 12a, having a flow rate equal to or greater than that of the air, against the air that may flow into the buffer space 15 at a speed at most equal to the speed at which the wafer 11 moves. In relation to this, more specifically, preferably the gap amount is equal to or less than 1 mm when the mold 8 and the wafer 11 are closest during pressing. In addition, the height of the opposing surface 13c in the projecting portion 13b is set in advance so as to enable realizing this gap amount. Note that the phrase "equal to or greater than the speed at which the wafer 11 moves" includes the meanings that, depending on the type of the gas 12, the flow rate of the gas 12 can be suitably varied depending on the required concentration of the gas 12 and the leakage concentration that can be tolerated when the gas 12 flows to the outside.

The wafer 11 is, for example, a single crystal silicon substrate or a SOI (Silicon on Insulator) substrate, and an ultraviolet curable resin, i.e., the resin 10, which is molded by the pattern part 8a formed on the mold 8, is applied on the treatment surface of the wafer 11.

The wafer stage (substrate holder) 5 holds the wafer 11 and implements the alignment of the mold 8 and the resin 10 during the pressing of the mold 8 and the resin 10 on the wafer 11. Although not illustrated, this wafer stage 5 includes a wafer chuck that holds the wafer 11 by a suction force and a stage drive mechanism that holds this wafer chuck by a mechanical means and can move at least in a direction along the surface of the wafer 11. Examples of a drive source that can be used in this stage drive mechanism are a linear motor and a planar motor. The stage drive mechanism may also be structured by a plurality of drive systems such as a coarse drive system and a fine drive system and the like in each of the X axis and Y axis directions. Furthermore, a structure is also possible that includes drive systems for position adjustment in the Z axis direction, a position adjustment function in the θ direction of the wafer 11, and a tilt function for correcting the tilt of the wafer 11 and the like. In addition, the wafer stage 5 is provided, on the side surface thereof, with a plurality of reference mirrors (reflecting units) corresponding to each of the X, Y, Z, ωx, ωy, and ωz directions. In contrast, the imprint apparatus 1 is provided with a plurality of laser interferometers (length measurement devices) 18 that measure the position of the wafer stage 5 by irradiating beams onto these reference mirrors 17. The laser interferometers 18 measure the position of the wafer stage 5 in real time, and a controller 7, described below, executes the positioning control of the wafer 11 (wafer stage 5) based on the measured value at this time. Note that not only a laser interferometers 18, but, for example, encoders and the like may be used as the length measuring device. In addition, in FIG. 1, to facilitate simplification, only one set is illustrated among each of the plurality of reference mirrors 17 and laser interferometers 18.

The dispenser 6 is arranged in proximity to the mold holding mechanism 3, and resin (uncured resin) 10 is applied on a shot, which serves as a pattern formation area present on the wafer 11. Here, this resin 10 is photo-cured resin (imprint material) having the property of being cured when exposed to ultraviolet light 9, and is suitably selected depending on various conditions of the semiconductor device manufacturing steps and the like. In addition, the amount of the resin 10 that is applied (ejected) from the dispenser 6 is also suitably determined depending on the desired thickness of the resin 10 that to be formed on the wafer 11 and the density of the pattern to be formed and the like.

The controller 7 can control the operation and adjustment and the like of each of the components of the imprint apparatus 1. The controller 7 is configured, for example, by a computer and the like, is connected via circuits to each of the components of the imprint apparatus 1, and can execute the control of each of the components according to a program and the like. In addition to the operation of the mold holding mechanism 3 and the wafer stage 5, the controller 7 of the present embodiment controls the gas supply by the gas supply mechanism 4 and the like. Note that the controller 7 may be integrally structured (housed in a the same case) with the other portions of the imprint apparatus 1, or may be structured as a separate unit (housed in a separate case) from the other portions of the imprint apparatus 1.

In addition, the imprint apparatus 1 is provided with a separating wall (second wall part) for suppressing the diffusion of the gas 12a, which has been supplied by the gas supply mechanism 4 and flows to the outside by passing through the gap under the opposing surface 13c, into the apparatus space overall. For example, when the gas 12 that is supplied from the gas supply mechanism 4 is helium, helium and air each have different refractive indexes for light, and thus, when helium penetrates into the light path 20 between the reference mirrors 17 and the laser interferometers 18, there is the possibility that measurement error may occur. Normally, the tolerated concentration of helium that can be allowed to penetrate into the light path 20 by the laser interferometers 18 is equal to or less than several ppm. In addition, also in the case in which a different length measuring device such as an encoder is used instead of the laser interferometers 18, the helium cannot be ignored because there are cases in which irregularities in the concentration of the helium will influence the high precision measurements. Thus, as shown in FIG. 1, a separating wall part 19 of the present embodiment encloses at least the mold 8 and the blowing unit 13 in order to separate them from the external environment, and in the interior thereof gas 12a (refer to FIG. 2) that has flowed out from the gap under the opposing surface 13c is exhausted. In this case, as shown in FIG. 1, the separating wall part 19 forms an exhaust path 21 that is connected to a vacuum pump (exhaust unit; not illustrated) and the like that is a negative pressure generating source, and the gas 12a is exhausted by passing through this exhaust path 21.

Figure 3:
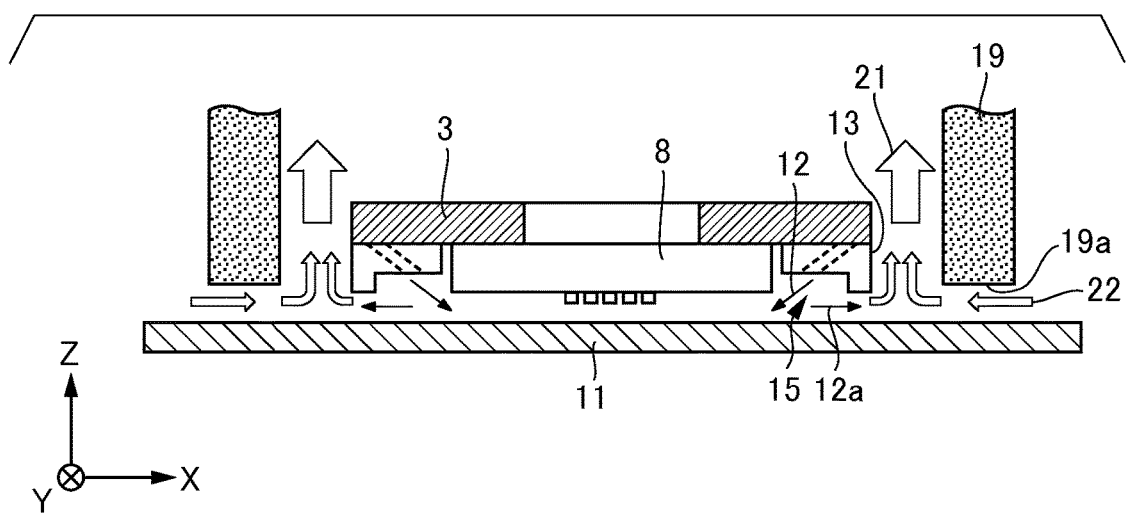
FIG. 3 is a drawing for explaining the flow of gas that is exhausted through a discharging path.

FIG. 3 is a schematic cross-sectional view for explaining the flow of the gas 12a that has been exhausted by passing through the exhaust path 21. In order for the vacuum pump to exhaust gas from the entire space that is enclosed by the separating wall part 19, external air flows, as shown by the arrow 22 in FIG. 3, into the interior of the separating wall part 19 from the gap between the end surface (separating wall surface) 19a of the separating wall part 19 that faces the wafer stage side 5 and the surface of the wafer 11. The air that has flowed therein is exhausted via the exhaust path 21 mixed with the gas 12a. In order to realize such exhaust, preferably the gap amount between the end surface 19a and the surface of the wafer 11 is set in conjunction with the discharging flow amount at which the vacuum pump exhausts the gas. In this case as well, the gap amount may be set such that the flow rate of the air that flows therein by passing under the end surface 19a becomes equal to or greater than the speed at which the wafer 11 moves. That is, the gas 12a in the separating wall part 19 can be prevented from flowing out to the outside even when the wafer 11 is moving by directing air, having a flow rate equal to or greater than that of the gas 12a, against the gas 12a that may flow out of the separating wall part 19 at a speed at most equal to the speed at which the wafer 11 moves. In relation to this, more specifically, preferably the gap amount in this case is equal to or less than 10 mm when the mold 8 and the wafer 11 are in closest proximity during pressing. In addition, the installation height of the end surface 19a of the separating wall part 19 is set in advance so as to enable realizing this gap amount.

Furthermore, although not illustrated, the imprint apparatus 1 can include an alignment measurement system that measures the alignment marks on the wafer 11, a mold conveying mechanism that conveys a mold 8 from the outside of the apparatus to the inside thereof, and a substrate conveying mechanism that conveys the wafer 11 from the outside of the apparatus to the inside thereof.

Next, the imprint processing by the imprint apparatus 1 will be explained. First, the controller 7 mounts and attaches the wafer 11 to the wafer stage 5 by using a substrate conveying apparatus. Next, the controller 7 sequentially measures the alignment marks on the wafer 11 by using an alignment measuring system while suitably changing the position of the wafer 11 by driving the stage drive mechanism, and detects the position of the wafer 11 with high precision. In addition, the controller 7 calculates each of the transfer coordinates based on the results of this detection, and forms patterns one by one for each predetermined shot based on the results of these calculations. As a flow for the pattern formation on one certain shot, the controller 7 first positions the application position (a predetermined position of the shot) on the wafer 11 below the blowing port of the dispenser 6 by using the stage drive mechanism. Subsequently, the dispenser 6 applies a resin 10 to the shot on the wafer 11 (the application step). Next, the controller 7 moves and positions the wafer 11 such that the shot is positioned at the pressing position directly under the pattern part 8a by using the stage drive mechanism. Next, after implementing the position alignment of the pattern part 8a and the shot, the controller 7 drives the mold drive mechanism and presses the pattern part 8a onto the resin 10 on the shot (mold pressing step). Due to this pressing, the resin 10 fills the contoured pattern of the pattern part 8a. Note that the controller 7 carries out the determination of the pressing completion by using a load sensor (not illustrated) that is arranged in the interior of the mold holding mechanism 3. In this state, the light irradiating unit 2 irradiates ultraviolet light 9 for a predetermined time from the back surface (upper surface) of the mold 8, which serves as a curing step, and the resin 10 is cured by the ultraviolet light 9 that has passed through the mold 8. In addition, after the resin 10 has been cured, the controller 7 drives the mold drive mechanism again, and separates the pattern part 8a from the wafer 11 (mold separation step). Thereby, a three-dimensional resin pattern (layer) that conforms to the contoured pattern of the pattern part 8a is formed on the surface of the shot on the wafer 11. The imprint apparatus 1 can form a plurality of resin patterns on one wafer 11 by executing such a series of imprint operations a plurality of times while changing the shot by driving the wafer stage 5.

Figure 4A:
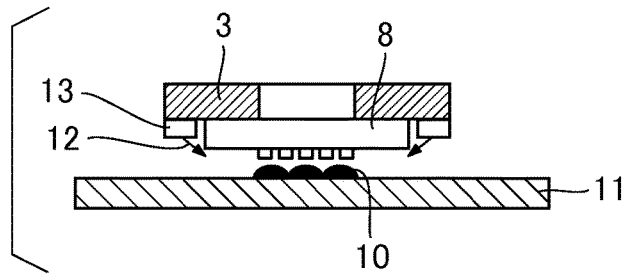
FIG. 4A is a drawing that shows the state upon start of a pressing operation.
Figure 4B:
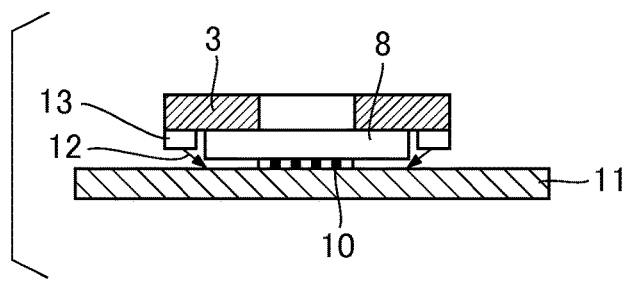
FIG. 4B is a drawing that shows the state where a resin is being cured after the pressing operation.
Figure 4C:
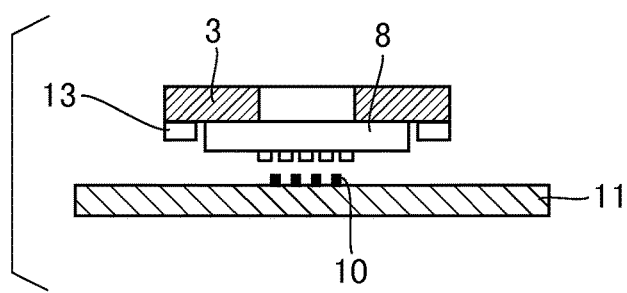
FIG. 4C is a drawing that shows the state of the cured resin after a separation operation.

In the mold pressing step described above, when the mold 8 and the resin 10 on the wafer 11 are pressed together, the resin 10 must completely fill the contoured pattern of the pattern part 8a. This is because when the curing of the resin 10 is implemented in a state in which bubbles are retained inside the resin 10 that has been filled into the contoured pattern, the resin pattern formed on the shot does not attain the desired profile and influences the article itself, such as a semiconductor device that is finally manufactured. FIG. 4 is a schematic cross-sectional view for explaining the imprint operation from the mold pressing step to the mold separation step. In particular, FIG. 4A shows a state in which the pressing operation has started, FIG. 4B shows a state in which the resin 10 is cured after the pressing operation, and FIG. 4C shows the state after the separation operation. In the mold pressing step and the curing step, the controller 7 fills the resin 10 over the fine portion of the contoured pattern of the pattern part 8a by supplying a gas 12 into the gap space between the mold 8 and the wafer 11, as shown in FIG. 4A to FIG. 4C, by using the gas supply mechanism 4. At this time, in the present embodiment, due to such a structure, it is possible to maintain the concentration of the gas 12 that is present in the gap space between the mold 8 and the shot on the wafer 11 at a high value. In particular, according to the present embodiment, because there is a buffer space 15 and the gas 12 in this buffer space 15 can be prevented from thinning due to the inflow of air from the outside, it is possible to fill a high concentration gas 12 into the gap space with high efficiency using a flow rate that is lower than a conventional flow rate. Furthermore, because the imprint apparatus 1 can recover the gas 12 with high efficiency by providing the separating wall part 19, the influence on the measured values of, for example, the laser interferometers 18, that is caused by the diffusion of the gas 12, can be suppressed as much as possible.

As explained above, according to the present embodiment, it is possible to provide an imprint unit that is advantageous on the point of efficiently suppressing the occurrence of unfilled portions in a pattern in the resin.

Figure 5:
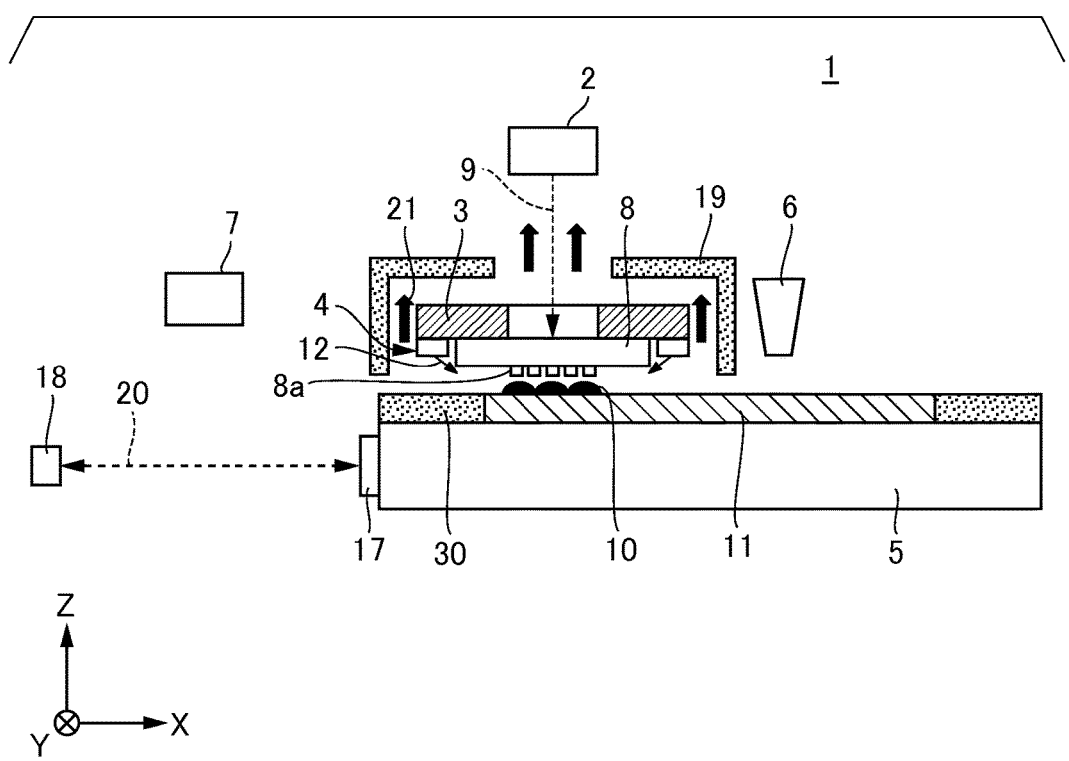
FIG. 5 is a drawing that shows a configuration of an imprint apparatus according to another embodiment of the present invention.

Note that in the present embodiment, although a projecting portion that forms a wall part for forming a buffer space 15 is made a projecting portion that is integrated with the blowing unit 13 for the gas 12, the present invention is not limited thereby. For example, the projecting portion may be made a member that is separate from the blowing unit 13 and provided in proximity to the side surface of the blowing unit 13. In addition, with respect to the location at which the separating wall part 19 is arranged, as described above, the invention is not thereby limited in particular provided that a gas 12a that flows out from the buffer space 15 can be exhausted without diffusing to the outside. The separating wall part 19 may be one in which, for example, the form of the structure that supports the mold holding mechanism 3 itself serves as a separating wall, and may cover the entire structure described above as an discharging hood. Furthermore, although the structure of the imprint apparatus 1 shown in FIG. 1 has been omitted, as shown in FIG. 5, for example, when the wafer stage 5 has a wafer 11 mounted thereon, a plate (same surface plate) 30 having a surface height (an identical height) aligned with the surface height of the wafer 11 may be arranged on the outside periphery thereof. Generally, the shots are set in proximity to the outer periphery on the surface of the wafer 11. That is, there are also cases in which the surface of the wafer 11 is not positioned directly under the blowing unit 13 or directly under the end surface 19a of the separating wall part 19 when imprint processing is carried out on the shots that are present at the outer peripheral area among the shots on the wafer 11. In such a case, by arranging the plate 30 on the wafer stage 5 as described above, the imprint apparatus 1 exhibits the effects that have been explained above no matter on which shots on the wafer 11 the imprint processing is implemented.

(Article Manufacturing Method)

A method for manufacturing a device (semiconductor integrated circuit element, liquid crystal display element, or the like) as an article may include a step of forming a pattern onto a substrate (wafer, glass plate, film-like substrate, or the like) using the imprint apparatus described above. Furthermore, the manufacturing method may include a step of etching the substrate on which a pattern has been formed. When other articles such as a patterned medium (storage medium), an optical element, or the like are manufactured, the manufacturing method may include another step of processing the substrate on which a pattern has been formed instead of the etching step. The device manufacturing method of this embodiment has an advantage, as compared with a conventional device manufacturing method, in at least one of performance, quality, productivity and production cost of a device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-087691 filed on Apr. 18, 2013, which is hereby incorporated by reference herein in its entirety.

What is claimed is:

1. An imprint apparatus which forms a pattern of an imprint material on a substrate by using a mold, the imprint apparatus comprising:
    a substrate holder configured to hold the substrate and move in a direction along the surface of the substrate;
    a gas supply unit configured to supply a first gas into a space between a pattern part of the mold and the substrate;
    a first wall part including a first end portion and disposed so as to enclose a first space including the space supplied with the first gas, the first end portion of the first wall part being a bottom portion of the first wall part that faces the substrate holder or the substrate with a first gap in a state where the mold and the substrate face each other;
    a second wall part including a second end portion and disposed so as to enclose the first wall part, the second end portion being a bottom portion of the second wall part that faces a top surface of the substrate holder or a top surface of the substrate with a second gap in a state where the mold and the substrate face each other; and
    a gas exhaust unit configured to exhaust the first gas from a second space between the first wall part and the second wall part such that a first gas flow is directed from the first space through the first gap toward the second space and a second gas flow is directed from beneath the second end portion of the second wall part toward the second space.

2. The imprint apparatus according to claim 1, wherein the gas supply unit comprises a supply port opposing the first space, and
    the first end portion is disposed, in a direction perpendicular to the surface of the substrate, more toward the substrate holder than the supply port.

3. The imprint apparatus according to claim 1, wherein the first end portion is disposed, in a direction perpendicular to the surface of the substrate, more distant from the substrate holder than the pattern part of the mold.

4. The imprint apparatus according to claim 1, wherein the first gap is 1 mm or less.

5. The imprint apparatus according to claim 1, wherein the first wall part is formed such that a flow rate of the first gas increases at the first gap.

6. The imprint apparatus according to claim 1, wherein the first gap is set such that, during a movement of the substrate holder, a flow speed of the first gas from the first space toward the first gas flow at the first gap becomes equal to or greater than the movement speed of the substrate holder.

7. The imprint apparatus according to claim 1,
    wherein the gas exhaust unit exhausts a second gas from the second space, the second gas is included in the second gas flow directed from beneath the second end portion of the second wall part toward the second space.

8. The imprint apparatus according to claim 7, wherein the second gap is set such that, during a movement of the substrate holder, a flow speed of the second gas toward the second gas flow at the second gap becomes equal to or greater than a movement speed of the substrate holder.

9. The imprint apparatus according to claim 1, further comprising an interferometer configured to measure a position of the substrate holder by using a light.

10. The imprint apparatus according to claim 1, wherein the gas exhaust unit exhausts the first gas having passed through the first gap while the supply unit supplies the first gas.

11. The imprint apparatus according to claim 7, wherein the second gap is set such that, during a movement of the substrate holder, a flow speed of the second gas toward the second gas flow at the second gap becomes greater than a flow speed of the first gas from the first space toward the first gas flow at the first gap.

12. The imprint apparatus according to claim 1, wherein the first gas reduces an occurrence of unfilled portions in the imprint material.

13. The imprint apparatus according to claim 1, wherein the first gas includes at least one of helium, carbon dioxide, nitrogen, hydrogen, xenon, or a compressible gas.

14. The imprint apparatus according to claim 1, further comprising a mold holder movable vertically,
    wherein the mold holder has the first wall part.

* * * * *